United States Patent
Dietl et al.

(12) 
(10) Patent No.: US 6,456,085 B1
(45) Date of Patent: Sep. 24, 2002

(54) DIAGNOSTIC DEVICE FOR DETECTING SHORT CIRCUITS OR LINE INTERRUPTIONS IN AN INDUCTIVE SENSOR

(75) Inventors: Franz Dietl, Cugnaux (FR); Alfons Fisch, Falkenstein; Frank Vogel, Regensburg, both of (DE); Horst Punzmann, Canberra (AU)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/577,062

(22) Filed: May 22, 2000

Related U.S. Application Data

(63) Continuation of application No. PCT/DE98/03414, filed on Nov. 18, 1998.

(30) Foreign Application Priority Data

Nov. 20, 1997 (DE) .......................................... 197 51 530

(51) Int. Cl.[7] .......................... G01R 31/14; G01R 31/28
(52) U.S. Cl. ....................... 324/509; 324/510; 324/522; 340/635
(58) Field of Search ................................. 324/509, 772, 324/244, 712, 705, 522, 510; 340/507, 511, 660–663, 635

(56) References Cited

U.S. PATENT DOCUMENTS

| | | | | |
|---|---|---|---|---|
| 4,344,032 A | * | 8/1982 | Jurgen | 324/772 |
| 5,734,269 A | * | 3/1998 | Sakai et al. | 324/706 |

FOREIGN PATENT DOCUMENTS

| | | |
|---|---|---|
| DE | 28 41 289 | 4/1980 |
| DE | 43 22 490 A1 | 1/1994 |
| DE | 195 26 435 A1 | 12/1996 |

* cited by examiner

*Primary Examiner*—N. Le
*Assistant Examiner*—Anjan K. Deb
(74) *Attorney, Agent, or Firm*—Laurence A. Greenberg; Werner H. Stemer; Gregory L. Mayback

(57) ABSTRACT

A symmetrical voltage divider whose tap is supplied with a reference voltage via a resistor is connected between the terminals of an inductive sensor. A diagnostic voltage is applied to the tap. Using evaluation devices, the diagnostic voltage is compared with two threshold values in a stationary state, and then sampled in the operational state, and a difference is calculated from the largest and smallest sampled, values and is compared with a third threshold value. Short circuits or line interruptions are detected from the comparison result and are displayed.

6 Claims, 2 Drawing Sheets

DIAGNOSTIC DEVICE FOR DETECTING SHORT CIRCUITS OR LINE INTERRUPTIONS IN AN INDUCTIVE SENSOR

CROSS-REFERENCE TO RELATED APPLICATION this is a continuation of copending International Application PCT/DE98/03414, filed Nov. 18, 1998, which designated the United States.

BACKGROUND OF THE INVENTION

Field of the Invention the invention relates to a diagnostic device for detecting short circuits or line interruptions in an inductive sensor, in particular short circuits to a battery voltage or to ground or line interruptions of the inductive sensor used in a motor vehicle, for example a crankshaft sensor or camshaft sensor of an internal combustion engine or of a wheel sensor of an antilock brake system (ABS) or traction control system (TCS).

An inductive sensor is, as a rule, composed of a coil that is wound around a magnetized core. A signal transmitter element in the form of a gearwheel made of a ferromagnetic material that moves in synchronism with the crankshaft, the camshaft or a wheel is sensed by the inductive sensor. The edges of the gearwheel induce a characteristic voltage in the coil of the sensor as they move past it. The voltage is sensed by an evaluation electronic system which is connected downstream of the sensor and contains a comparator, and the voltage is shaped to form a digital output signal which is further processed in downstream control devices.

Basically, inductive sensors can be used wherever the position, rotational speed, or velocity of a movable signal transmitter element is to be sensed.

If such a sensor has symmetrical input wiring, in the event of a line interruption or short circuit it continues to supply an output signal whose profile does not permit reliable detection of the fault. However, this does not allow the strict requirements associated with prescribed on-board diagnosis to be met reliably and would result in incorrect diagnoses. In the course of development of electronic components for motor vehicle electronics, it has become apparent that there is a need to enable short circuits or line interruptions that may occur at any points in the sensor or in the sensor lines to be sensed, evaluated and displayed.

Published, Non-Prosecuted German Patent Application DE 28 41 289, corresponding to U.S. Pat. No. 4,344,032, discloses a method and a device for testing inductive sensors. A first signal that is proportional to the amplitude of the voltage generated by the pulse transmitter is formed, and at the same time a second signal which is proportional to the frequency of the pulses is formed. From the ratio of the first to the second signal, a third signal is formed which is compared with a predefined variable which is typical of the configuration of a pulse transmitter, the difference between the third signal and the typical variable being used as a quality criterion. The three signals are formed simultaneously by a coil as a low-pass filter that is connected to a shunt resistor between the terminals of the inductive signal transmitter, an evaluation unit being connected to the connecting point of the coil and the resistor. This method and the associated device serve the purpose of enabling the inductive pulse transmitter to be checked in the frequency range or rotational speed range that is of interest, particularly at low rotational speeds. In addition, the intention is to test whether sufficiently high signals are output in wheel sensors of antilock brake systems so that the position of the wheel sensor can also be tested with respect to the signal transmitter element. Sources of faults that occur essentially directly in the inductive sensor are detected and evaluated.

Published, Non-Prosecuted German Patent Application DE 195 26 435 A1 discloses a circuit configuration for detecting fault currents or leakage currents on the supply line of an electronic circuit when the supply voltage is switched off. Both a current source that is fed from an auxiliary voltage and a voltage divider which connects to ground are connected to the supply line, the potential which is obtained on the supply line when the supply voltage is switched off being determined and evaluated via the tap of the voltage divider by a potential monitor. When the voltage supply is switched on, it is not possible to use this circuit to detect either short circuits to the battery voltage or to the earth potential or line interruptions.

SUMMARY OF THE INVENTION

It is accordingly an object of the invention to provide a diagnostic device for detecting short circuits or line interruptions in an inductive sensor which overcomes the above-mentioned disadvantages of the prior art devices of this general type, in which short circuits to ground or to the battery voltage can be reliably detected, evaluated and displayed not only when the sensor is stationary, but also in the operational state. In addition, line breaks in the sensor or its feeder lines in the entire frequency range of the sensor can also be detected and evaluated.

With the foregoing and other objects in view there is provided, in accordance with the invention, a diagnostic device for detecting short circuits and line interruptions in an inductive sensor formed of a coil wound around a magnetic core and generating a sensor output signal to be converted into a digital sensor signal for further processing in a control device of an evaluation electronic system, the diagnostic device containing:

a resistor for receiving a voltage reference;

a voltage divider to be connected between terminals of the inductive sensor and having a tap connected to the resistor for receiving the reference voltage via the resistor; and an evaluation device connected to the voltage divider for receiving and conditioning a diagnostic signal tapped off at the tap resulting in a conditioned signal, the evaluation device comparing the conditioned signal with threshold values, a short circuit or a line interruption is detected if the threshold values are exceeded or undershot.

In accordance with an added feature of the invention, the voltage divider is a symmetrical voltage divider in which the resistors are of equal value.

In accordance to an additional feature of the invention, the evaluation device has an analog/digital converter receiving the diagnostic signal. The analog/digital converter samples the diagnostic signal in continuously successive measurement periods in one of a constant interval and chronologically unequal intervals that are longer or shorter than a period length of the sensor output signal. A largest sampled value Vmax, a smallest sampled value Vmin and their difference Vss is determined in each measurement period. The evaluation device further has a comparator unit connected to the analog/digital converter for comparing the largest sampled value Vmax, the smallest sampled value Vmin and the difference Vss with the threshold values. If an internal combustion engine is stationary and if Vmax=Vmin=Vdiag, where Vdiag is the diagnostic signal, a short circuit to a battery voltage is detected if Vdiag<S1 or a short circuit to earth is detected if Vdiag<S2. If the internal combustion engine is operating, the short circuit to the battery voltage, the short circuit to earth, or a line interruption in the sensor feeder lines are detected if Vss>S3, where S1, S2 and S3 are the threshold values.

In accordance with another feature of the invention, the diagnostic signal has a d.c. voltage component and the evaluation device, includes a high-pass filter for filtering out the d.c. voltage component of the diagnostic signal resulting in a filtered signal. A rectifier is connected to the high-pass filter and receives and rectifies the filtered signal resulting in a rectified signal. A capacitor is connected to the rectifier for receiving and smoothing the rectified signal resulting in a d.c. voltage signal. A comparator unit receives and compares the diagnostic signal with a first threshold value and a second threshold value of the threshold values. The comparator unit further receives and compares the d.c. voltage signal with a third threshold value of the threshold values. If an internal combustion engine is stationary and if Vmax=Vmin=Vdiag a short circuit to a battery voltage'is detected if Vdiag>S1 and a short circuit to earth is detected if Vdiag<S2 and, if the internal combustion engine is operating, the short circuit to the battery voltage, the short circuit to the earth, or a line interruption in sensor feeder lines are detected if Vss'>S3', where S1 is the first threshold value, S2 is the second threshold value, S3' is the third threshold value, Vdiag is the diagnostic signal, vss' is the d.c. voltage signal, Vmax is a largest sampled value, and Vmin is a smallest sampled value.

In accordance with a concomitant feature of the invention, a display unit is provided and connected to the comparator unit for displaying the short circuits and the line interruptions detected in the comparator unit.

The diagnostic device according to the invention has the essential advantage that simple hardware components or software components are sufficient to detect and display the aforementioned faults reliably.

Other features which are considered as characteristic for the invention are set forth in the appended claims.

Although the invention is illustrated and described herein as embodied in a diagnostic device for detecting short circuits or line interruptions in an inductive sensor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

DESCRIPTION OF THE PREFERRED EMBODIMENTS

Figure 1:
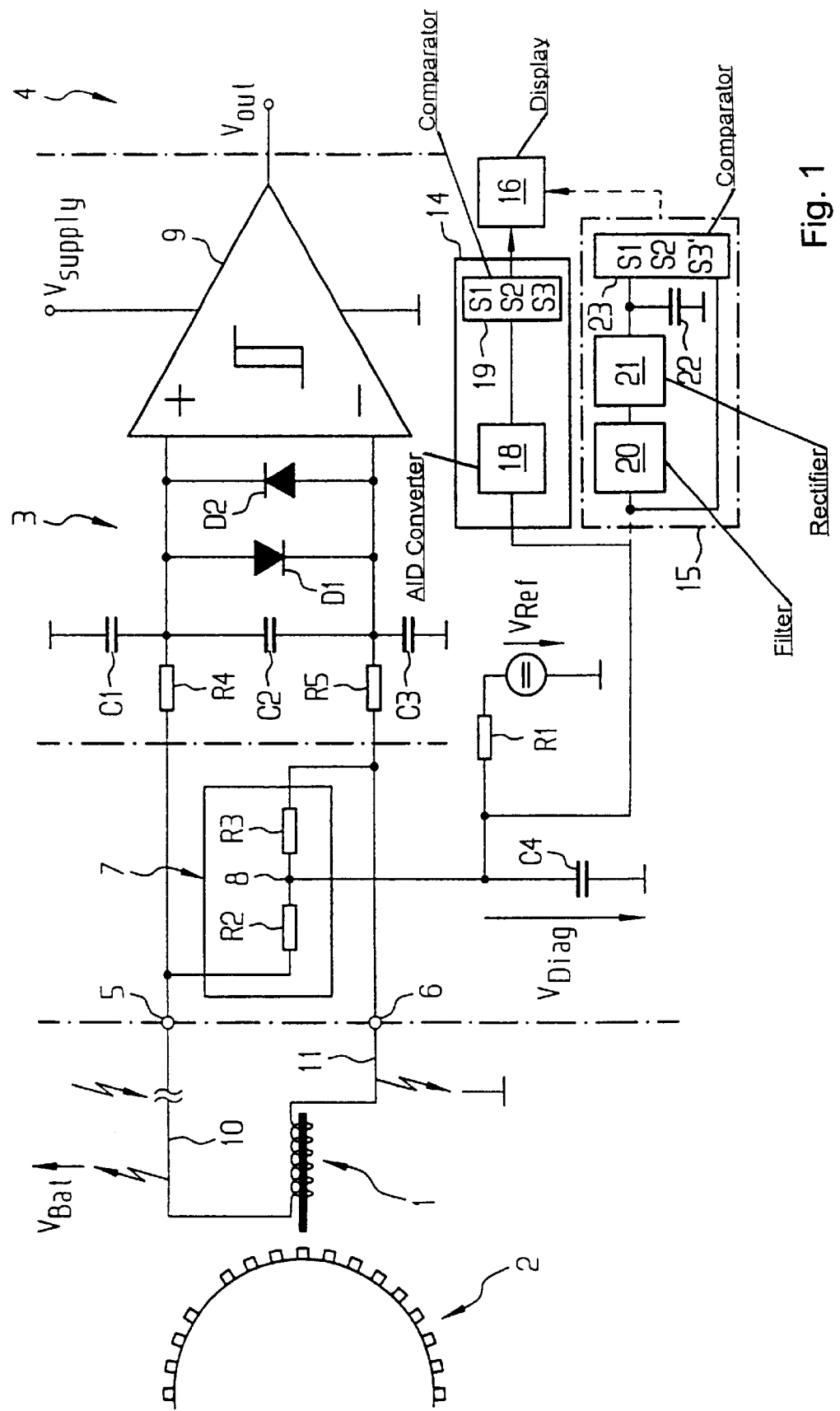
FIG. 1 is a block circuit diagram illustrating a diagnostic device according to the invention.

Referring now to FIG. 1 of the drawings, there is shown an inductive crankshaft sensor 1 of an internal combustion engine of a motor, composed of a coil that is wound around a magnetized core. A signal transmitter element 2 being a gearwheel that is connected to a crankshaft of the internal combustion engine moves past the sensor 1. Feeder lines 10, 11 connect the sensor 1 to an evaluation unit. The reference numerals 5 and 6 designate terminals of the inductive sensor 1. The terminals 5 and 6 are connected via two resistors R4 and R5 to a downstream evaluation electronic system 3 which is operated by a supply voltage source Vsupply which is derived from a battery voltage source Vbat of the motor vehicle by a fixed voltage regulator.

The evaluation electronic system 3 is composed essentially of a comparator 9 whose digital output signal Vout is a sensor signal which is fed to an engine control unit 4. The comparator 9 may have a non-illustrated hysteresis circuitry. Two antiparallel diodes D1 and D2 for signal limiting are connected between a noninverting (+) input and an inverting (−) input of the comparator 9. A capacitor C2 is connected between the two inputs of the comparator 9; a capacitor C1 is connected between the noninverting input (+) and a ground reference potential, and a capacitor C3 is connected between the inverting input (−) and the ground reference potential. The capacitors C1, C2, C3 have, in their interaction with the resistors R4 and R5, a low-pass characteristic in order to gate out high-frequency components of the inductive sensor signal and/or interference. The sensor signal that is digitized for further processing appears at an output of the comparator 9.

A voltage divider 7, composed of two resistors R2 and R3 in the exemplary embodiment, is connected between the terminals 5 and 6 of the inductive sensor 1, a tap 8 of the voltage divider 7 has a reference voltage Vref applied to it via a resistor R1. A diagnostic voltage Vdiag can be tapped at the terminal 8 and can be evaluated, as described below, for the purpose of diagnosing characteristic short circuits or line interruptions. In order to gate out high-frequency interference, a capacitor C4 is connected between the tap 8 and the ground reference potential.

The voltage divider 7 which is composed of the resistors R2, R3 is symmetrical, i.e. R2=R3. When the internal combustion engine is stationary, if no short circuits have occurred, the diagnostic voltage Vdiag corresponds to the reference voltage Vref. If the internal combustion engine is in the operational state, with the crankshaft rotating, the reference voltage Vref has the sensor signal, an alternating voltage, superimposed on it.

The diagnostic voltage Vdiag which is present at the tap 8 is fed to an evaluation device 14 which is part of a microprocessor and which essentially performs the functions of an analog/digital converter 18 and of a comparator unit 19 which is connected downstream of it.

In the operational state when the crankshaft is rotating, the reference voltage Vref has the sensor signal superimposed on it with the sensor signal being an alternating voltage. The two together form the diagnostic voltage Vdiag.

The sensor signal that is produced when the internal combustion engine is running has an approximately sinusoidal profile with a variable frequency. A period length corresponds to a current tooth time of a tooth of the signal transmitter element 2, i.e. the rotational speed of the internal combustion engine. The sensor signal is sampled in the evaluation device 14 in continuously successive measurement periods Tm (for example, several 10s of milliseconds in length) at chronological intervals which are dependent on the processing capacity of the microprocessor used and, depending on a frequency of the sensor signal, signify undersampling or oversampling. A sampling frequency being selected to be variable with a constant period length of the sensor signal in order to avoid constant sampled values.

The respectively largest and smallest sampled values in each measurement period Tm are considered as the maximum amplitude value Vmax and minimum amplitude value Vmin of the sensor signal of the measurement period Tm and the difference Vss=Vmax−Vmin is calculated from these two values. The longer the measurement period Tm or the higher the number of sampled values per measurement period, the more precisely the determination of Vss.

If a fault (short circuit to the battery voltage or ground or line break) occurs in the operational state, the sensor signal, i.e. the difference Vss, is greater than in the fault-free normal state. By comparing the difference Vss with a third threshold value S3 in the comparator unit 19 it is possible for this case to be reliably diagnosed: a fault occurs if Vss>S3.

In a stationary state of the internal combustion engine, when there is a short circuit between one of the connecting lines 10 or 11 and the battery voltage Vbat, a compensation current flows between the latter and the reference voltage source Vref via the resistor R1 and the parallel connection of R2 and R3, which compensation current generates a voltage drop at all the resistors. The diagnostic voltage Vdiag at the tap 8 then corresponds to the sum of the reference voltage Vref and of the voltage V(R1) which drops across the resistor R1:Vdiag=Vref+V(R1).

When a short circuit is assumed (likewise in the stationary state of the internal combustion engine) between one of the connecting lines 10 or 11 and the ground reference potential, a current flows from the reference voltage source Vref via the resistor R1 and the parallel connection of R2 and R3 to the ground reference potential. The diagnostic voltage Vdiag at the connecting point 8 is then lower, by the amount of the voltage drop V(R1). at the resistor R1, than the reference voltage Vref:Vdiag=Vref−V(R1).

By comparing the sampled diagnostic voltage Vdiag with the first and second threshold values S1 and S2 in the comparator unit 19, in which case, for example, S1=Vref+V(R1)/2 and S2=Vref−V(R1)/2 (both threshold values must however not be symmetrical with the reference voltage), these faults can be reliably diagnosed and displayed. Because, in this case, the sampled values are constant, the difference Vss=0V and Vss<S3.

A line break cannot be detected in the stationary state of the internal combustion engine.

If a fault occurs in the operational state, but not in the stationary state of the internal combustion engine, it can be concluded that a line break has occurred.

The faults that have occurred can be displayed by a display device 16.

The evaluation described requires little outlay on hardware because the microprocessor that is present in any case can also be used, but as a result a somewhat greater degree of outlay on software is necessary.

The same evaluation result in the operational state can be achieved with somewhat more outlay on hardware and without an outlay on software if, instead of the evaluation device 14, a further evaluation device 15 (shown by broken lines) which has a high-pass filter 20 to which a rectifier 21, a capacitor 22 (or low-pass filter or integrator) and a comparator unit 23, is used.

The d.c. voltage component of the diagnostic voltage Vdiag is filtered out in the high-pass filter 20. The remaining sensor signal is rectified in the rectifier 21 and shaped in the capacitor 22 to form a d.c. voltage signal Vss', which is compared with a threshold value S3' in the downstream comparator unit 23. A short circuit to the battery voltage or to ground or a line break has occurred if Vss'>S3'. In the stationary state of the internal combustion engine, the original diagnostic signal Vdiag must, in this case, be compared with both threshold values S1 and S2 in the comparator unit 23.

Figure 2:
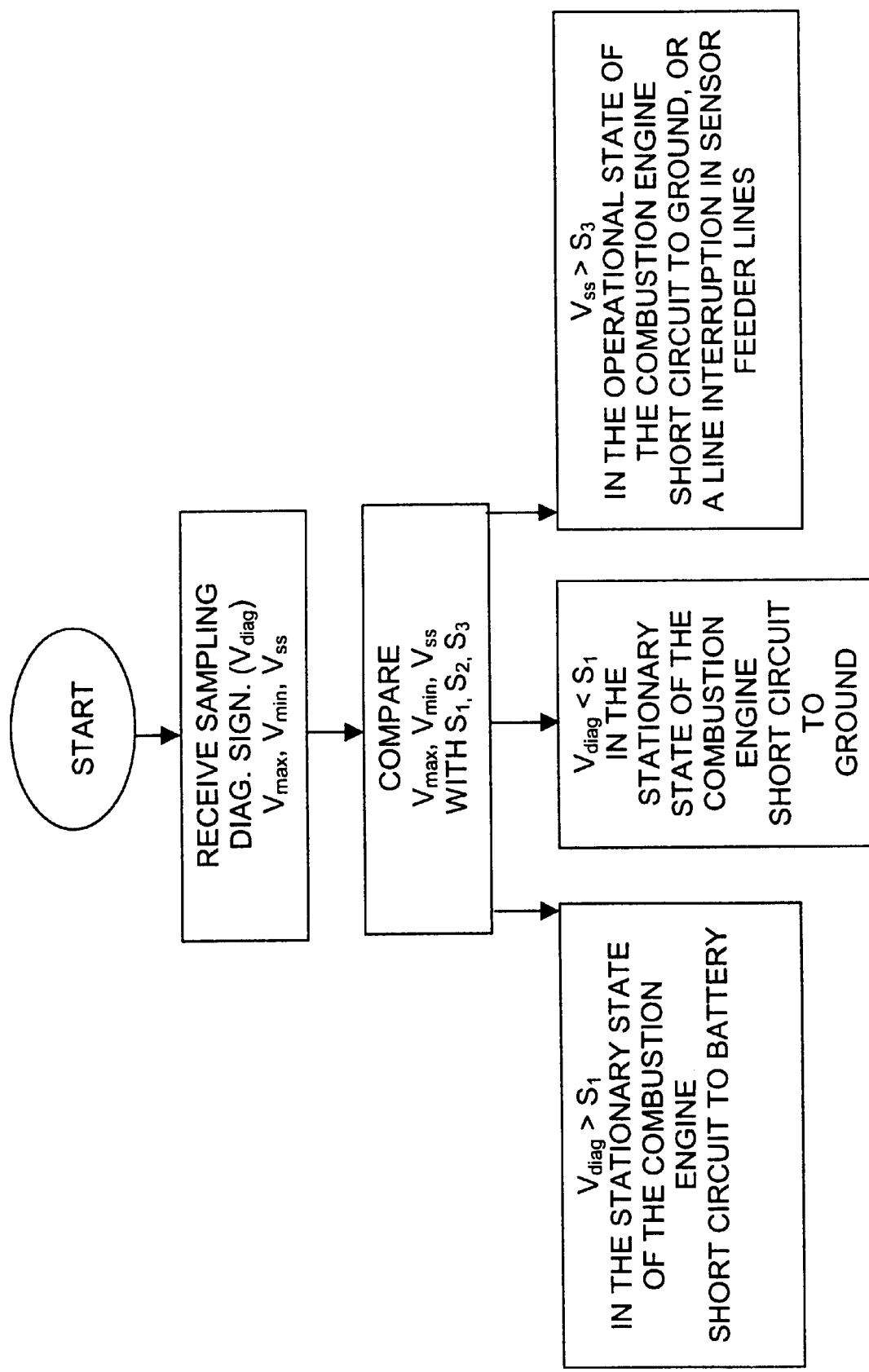
FIG. 2 is a flow chart illustrating the different sequences performed by the evaluation device.

Overal the following evaluation is obtained, as illustrated in FIG. 2. In the operational state of the internal combustion engine a short circuit to the battery voltage or to ground or line break has occurred if Vss>S3 or Vss'>S3'. In the stationary state of the internal combustion engine a short circuit to the battery voltage has occurred if Vdiag>S1; a short circuit to ground has occurred if Vdiag<S2.

We claim:

1. A diagnostic device for detecting short circuits and line interruptions in an inductive sensor formed of a coil wound around a magnetic core and generating a sensor output signal to be converted into a digital sensor signal for further processing in a control device of an evaluation electronic system, the diagnostic device comprising:

a resistor for receiving a voltage reference;

a voltage divider to be connected between terminals of the inductive sensor and having a tap connected to said resistor for receiving the reference voltage via said resistor; and an evaluation device connected to said voltage divider for receiving and conditioning diagnostic signal tapped off at said tap resulting in a conditioned signal, said evaluation device comparing the conditioned signal with threshold values, one of a short circuit and a line interruption being detected if the threshold values are exceeded or undershot.

2. The diagnostic device according to claim 1, wherein said voltage divider is a symmetrical voltage divider.

3. The diagnostic device according to claim 1, wherein:

said evaluation device has an analog/digital converter receiving the diagnostic signal, said analog/digital converter programmed to sample the diagnostic signal in continuously successive measurement periods in one of a constant interval and in chronologically unequal intervals being one of longer and shorter than a period length of the sensor output signal, a largest sampled value Vmax, a smallest sampled value Vmin and their difference Vss being determined in each measurement period; and said evaluation device has a comparator unit connected to said analog/digital converter for comparing the largest sampled value Vmax, the smallest sampled value Vmin and the difference Vss with the threshold values, if an internal combustion engine is stationary and if Vmax=Vmin=Vdiag, where Vdiag is the diagnostic signal, a short circuit to a battery voltage is detected if Vdiag>S1 and a short circuit to earth is detected if Vdiag<S2 and, if the internal combustion engine is operating, the short circuit to the battery voltage, the short circuit to earth, or a line interruption in sensor feeder lines being detected if Vss>S3, where S1, S2 and S3 are the threshold values.

4. The diagnostic device according to claim 1, wherein:

the diagnostic signal has a d.c. voltage component; and said evaluation device, includes:

a high-pass filter for filtering out the d.c. voltage component of the diagnostic signal resulting in a filtered signal;

a rectifier following and connected to said high-pass filter for receiving and rectifying the filtered signal resulting in a rectified signal;

a capacitor connected to said rectifier for receiving and smoothing the rectified signal resulting in a d.c. voltage signal; and a comparator unit receiving and comparing the diagnostic signal with a first threshold value and a second threshold value of the threshold values, said comparator unit further receiving and comparing the d.c. voltage signal with a third threshold value of the threshold values, if an internal combustion engine is stationary and if Vmax=Vmin=Vdiag a short circuit to a battery voltage is detected if Vdiag>S1 and a short circuit to earth is detected if Vdiag<S2 and, if the internal combustion engine is operating, the short circuit to the battery voltage, the short circuit to the earth, or a line interruption in sensor feeder lines are detected if Vss'>S3', where S1 is the first threshold value, S2 is the second threshold value, S3' is the third threshold value, Vdiag is the diagnostic signal, vss' is the d.c. voltage signal, Vmax is a largest sampled value, and Vmin is a smallest sampled value.

5. The diagnostic device according to claim 3, including a display unit connected to said comparator unit for displaying the short circuits and the line interruptions detected in said comparator unit.

6. The diagnostic device according to claim 4, including a display unit connected to said comparator unit for displaying the short circuits and the line interruptions detected in said comparator unit.

* * * * *